(12) United States Patent
Kimura

(10) Patent No.: US 6,331,738 B1
(45) Date of Patent: Dec. 18, 2001

(54) SEMICONDUCTOR DEVICE HAVING A BGA STRUCTURE

(75) Inventor: Naoto Kimura, Kumamoto (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/444,232

(22) Filed: Nov. 19, 1999

(30) Foreign Application Priority Data

Dec. 8, 1998 (JP) .................................................. 10-349200
Oct. 5, 1999 (JP) .................................................. 11-283775

(51) Int. Cl.$^7$ ............................. H01L 23/48; H01L 23/52
(52) U.S. Cl. ...................... 257/787; 257/692; 257/693; 257/695; 257/696
(58) Field of Search ............................ 257/734, 666, 257/787, 737, 690, 692, 693, 694, 695, 696; 438/613, 123; 361/813

(56) References Cited

U.S. PATENT DOCUMENTS

| | | | |
|---|---|---|---|
| 5,677,566 | 10/1997 | King et al. | 257/666 |
| 5,714,405 | * 2/1998 | Tsubosaki et al. | 438/613 |
| 5,805,422 | * 9/1998 | Otake et al. | 361/749 |

FOREIGN PATENT DOCUMENTS

| | | | | |
|---|---|---|---|---|
| 4-85837 | 3/1992 | (JP) | ................ | H01L/21/60 |
| 7-283360 | 10/1995 | (JP) | ................ | H01L/23/50 |
| 08-097312 | 4/1996 | (JP) | ................ | H01L/23/02 |
| 8-148608 | 6/1996 | (JP) | ................ | H01L/23/12 |
| 8-306853 | 11/1996 | (JP) | ................ | H01L/23/50 |
| 08-340074 | 12/1996 | (JP) | ................ | H01L/23/50 |
| 9-92678 | 4/1997 | (JP) | ................ | H01L/21/60 |
| 9-162349 | 6/1997 | (JP) | ................ | H01L/23/50 |
| 09-213839 | 8/1997 | (JP) | ................ | H01L/23/28 |
| 9-246454 | 9/1997 | (JP) | ................ | H01L/23/50 |
| 10-02329 | 1/1998 | (JP) | ................ | H01L/21/60 |
| 10-22329 | 1/1998 | (JP) | ................ | H01L/21/60 |
| 10-056125 | 2/1998 | (JP) | ................ | H01L/23/50 |
| 10-107075 | 4/1998 | (JP) | ................ | H01L/21/60 |
| 10-163382 | 6/1998 | (JP) | ................ | H01L/23/28 |
| 10-223699 | 8/1998 | (JP) | ................ | H01L/21/60 |
| 11-243172 | 9/1999 | (JP) | ................ | H01L/23/50 |
| 2000-150572 | 5/2000 | (JP) | ................ | H01L/21/60 |
| 2000-232181 | 8/2000 | (JP) | ................ | H01L/23/12 |

* cited by examiner

*Primary Examiner*—Jhihan B Clark
(74) *Attorney, Agent, or Firm*—Hayes, Soloway, Hennessey, Grossman & Hage, P.C.

(57) ABSTRACT

A semiconductor device is provided with a semiconductor chip and a connection lead connected to a pad of the semiconductor chip. The connection lead has a tip part which is bent up to a surface of the semiconductor chip on the opposite side of the pad. The semiconductor device is further provided a resin sealed part covering the semiconductor chip and a solder ball provided on the tip part of the connection lead.

7 Claims, 11 Drawing Sheets

SEMICONDUCTOR DEVICE HAVING A BGA STRUCTURE

BACKGROUND OF THE INVENTION

1. Field of the Invention

The present invention relates to semiconductor device having a BGA structure and methods for manufacturing the semiconductor device, and more particularly to a semiconductor device having a BGA structure and the method for manufacturing the same, the semiconductor device being capable of preventing the generation of cracks in a solder ball with an impact propagated from a printed wiring board at the time of a fall impact test and at a time of a temperature cycle test, which tests are carried out in the state in which the semiconductor device is attached on the printed wiring board.

2. Description of the Related Art

Conventionally, there is available a semiconductor device in which a lead is used in the connection terminal. FIG. 1 is a sectional view showing a semiconductor device in which a lead is used as the connection terminal.

As shown in FIG. 1, in the semiconductor device 50, in which the lead is used as the connection terminal, there is provided a semiconductor chip 71, and an internal leads 73a of a plurality of connection leads 73 are arranged in parallel with the upper surface of the semiconductor chip 71 above the semiconductor chip 71. The semiconductor chip 71 and the internal leads 73a of the connection leads 73 are stuck and fixed with a sticking tape 79 comprising an insulator. Furthermore, a pad 75 formed on a central part of the upper surface of the semiconductor chip 71 and the internal leads 73a of the connection leads are electrically connected with wires 76.

The semiconductor chip 71, the sticking tape 79, the internal leads 73a of the connection leads 73, the pad 75 and the wire 76 are covered with the result that a resin sealed part 72 is formed. Furthermore, external leads 73b of the connection leads 73 are extended from the resin sealed part 72 and bent, and the tips of the external leads 73b are arranged under a lower surface of the resin sealed part 72.

In the semiconductor device 50 which is constituted in this manner, the tips of the external leads 73b are fixed and connected electrically to predetermined portions of a printed wiring board with soldering or the like, and the semiconductor device 50 is set on the printed wiring board.

In the semiconductor device 50, however, since the connection terminal is composed of the lead, it is required to prepare a solder or the like separately in advance to connect the connection terminal to the printed wiring board with the solder in the case where the connection terminal is attached on the printed wiring board. Thus, there is a disadvantage that the connection work is troublesome.

As a semiconductor device which has overcome that disadvantage, there is available a BGA (Ball Grid Array) structure. The BGA structure is constituted with a ball having a connection lead comprising solder or the like. Two kinds of semiconductor devices having the BGA structure will be explained in the forgoing description.

FIG. 2A is a perspective view showing a semiconductor device having the BGA structure disclosed in U.S. Pat. No. 5,677,566, FIG. 2B is a sectional view thereof. As shown in FIGS. 2A and 2B, in the first conventional semiconductor device having the BGA structure 110, there is provided a die pad 140 and a semiconductor chip 114 provided thereon. Furthermore, a plurality of connection leads 115 are electrically connected to the pad 118 formed on the end part of the upper surface of the semiconductor chip 114 with a wire 122. Furthermore, solder balls 128 are allowed to bond on the upper surfaces of the connection leads 115, respectively. A part of the solder ball 128 and the connection lead 115 are exposed and are covered together with the die pad 140, the semiconductor chip 114, the pad 118 and the wire 122 so that a resin sealed part 126 is formed.

In the first semiconductor device 110 having the BGA structure which is constituted in this manner, the solder balls 128 are allowed to come into contact with a predetermined positions of a printed wiring board. Then, by means of a reflow method for allowing the solder balls 128 to come into contact with predetermined positions of the printed wiring board and heating or pressing the solder ball 128 to melt, the semiconductor device is fixed to a predetermined position of the printed wiring board, and, at the same time, is electrically connected to the printed wiring board and is attached on the printed wiring board.

FIG. 3A is a perspective view showing the semiconductor device having the BGA structure disclosed in the Japanese Unexamined Patent Publication No. Hei 9-213839, FIG. 3B is a sectional view thereof. As shown in FIGS. 3A and 3B, in the second conventional semiconductor device 150 having the BGA structure, there is provided a semiconductor chip 151. Above the semiconductor chip 151, internal leads 155 of the plurality of the connection leads are arranged in parallel with the upper surface of the semiconductor chip 151. The semiconductor chip 151 and the internal leads 155 of the connection leads are stuck and fixed with the sticking tape 152 comprising the insulator. Furthermore, the plurality of pads 153 formed on the upper surface of the semiconductor chip 151 and the internal leads 155 of the connection leads are electrically connected with wires 154.

Furthermore, the semiconductor chip 151, the sticking tape 152, the internal leads 155 of the connection leads, the pads 153 and the wires 154 are covered with an upper package member 156 comprising a sealed resin and a lower package member 157 so that the resin sealed part is formed. At positions of the surface on the side of the internal leads of the lower package member 157 which position leads to the internal lead 155, small orifices are provided. Within the small orifices, a plurality of solder balls 158 are embedded in such a manner that each head part thereof is extended from the surface of the lower package member 157 as an external part connection terminal. This solder ball 158 is electrically connected to the internal lead 155.

In the second conventional semiconductor device 150 having the BGA structure which is constituted in this manner, in the same manner as the first conventional semiconductor device 110 having the BGA structure, by means of the reflow method for allowing the solder balls 158 to come into contact with predetermined positions of the printed wiring board 169 and heating or pressing the solder ball 158 to melt, the semiconductor device is fixed to a predetermined position of the printed wiring board 169, and at the same time, the semiconductor device is electrically connected and is attached on the printed wiring board 169.

However, as has been described above, in the first conventional semiconductor device 110 having the BGA structure and the second conventional semiconductor device having the BGA structure 150, the solder balls are embedded in the resin sealed part. As a result, an impact is propagated to the resin sealed part via the solder balls without an alleviation of the impact which is propagated from the printed wiring board at the time of the fall impact test and the temperature cycle test, which are performed in a state in which the solder balls are attached on the printed wiring board. Since the impact is applied from the resin sealed part as a the reaction force, there is a problem that a crack is generated on a bond surface with the printed wiring board in the solder ball and on a bond surface of the resin sealed part.

SUMMARY OF THE INVENTION

An object of the present invention is to provide a semiconductor device having a BGA structure and a method for manufacturing the same, the device being capable of preventing the generation of a crack in a solder ball with a impact propagated from the printed wiring board at the time of a fall impact test and the temperature cycle test, which are performed in a state in which the solder ball is attached on the printed wiring board.

According to one aspect of the present invention, a semiconductor device is provided with a semiconductor chip and a connection lead connected to a pad of the semiconductor chip. The connection lead has a tip part which is bent up to a surface of the semiconductor chip on the opposite side of the pad. The semiconductor device is further provided a resin sealed part covering the semiconductor chip and a solder ball provided on the tip part of the connection lead.

According to another aspect of the present invention, a semiconductor device is provided with a semiconductor chip and a connection lead connected to a pad of the semiconductor chip. The connection lead has a tip part which is bent back. The semiconductor device is further provided a resin sealed part covering the semiconductor chip and a solder ball provided on the tip part of the connection lead.

According to another aspect of the present invention, a semiconductor device is provided with a semiconductor chip and a connection lead connected to a pad of the semiconductor chip. The connection lead has a tip part which is bent back. The semiconductor device is further provided a resin sealed part covering the semiconductor chip, a lead resin part provided at the tip part of the connection lead, and a solder ball provided on the lead resin part.

According to the present invention, the impact propagated from the printed wiring board to the solder ball at the time of the fall impact test and the temperature cycle test, which are performed in the state in which the solder ball is provided on the printed wiring board is absorbed with an elastic deformation of the connection lead. Through such a procedure the generation of a crack on the solder ball can be prevented.

It is preferable that a buffer member is provided on the tip part of the connection lead at the opposite side to the resin sealed part. Through such a construction, in the case where the impact propagated from the printed wiring board to the solder ball at the time of the fall impact test and the temperature cycle test described above can not be completely absorbed with the elastic deformation, the impact propagated to the resin sealed part can be absorbed because a buffer member is provided on a surface opposite to the resin sealed part. As a consequence, the impact applied to the solder ball from the resin sealed part can be alleviated with the reaction. As a result of this, in the case where the impact cannot be absorbed with the elastic deformation of the connection lead, the generation of cracks on the solder ball can be prevented.

In this case, the buffer member described above may be constituted with a member selected from a group comprising a silicone tape, a thermosetting resin tape and a thermoplastic tape.

According to another aspect of the present invention, a method for manufacturing a semiconductor device having a BGA structure comprise the step of connecting a connection lead to a pad of a semiconductor chip. Then, a resin sealed part covering the semiconductor chip is formed. Next, the connection lead is cut to a predetermined length. Thereafter a tip part of the connection lead is bent back. Then, a solder ball is provided on the tip of the connection lead.

Preferably, the method comprises a step of providing a buffer member on the tip part of the connection lead at the opposite side to the resin sealed part before the step of cutting the connection lead.

Furthermore, the step of providing the buffer member allows providing the buffer member at a predetermined position of the connection lead before the step of cutting the connection lead to a predetermined length.

DESCRIPTION OF THE PREFERRED EMBODIMENTS

Figure 1:
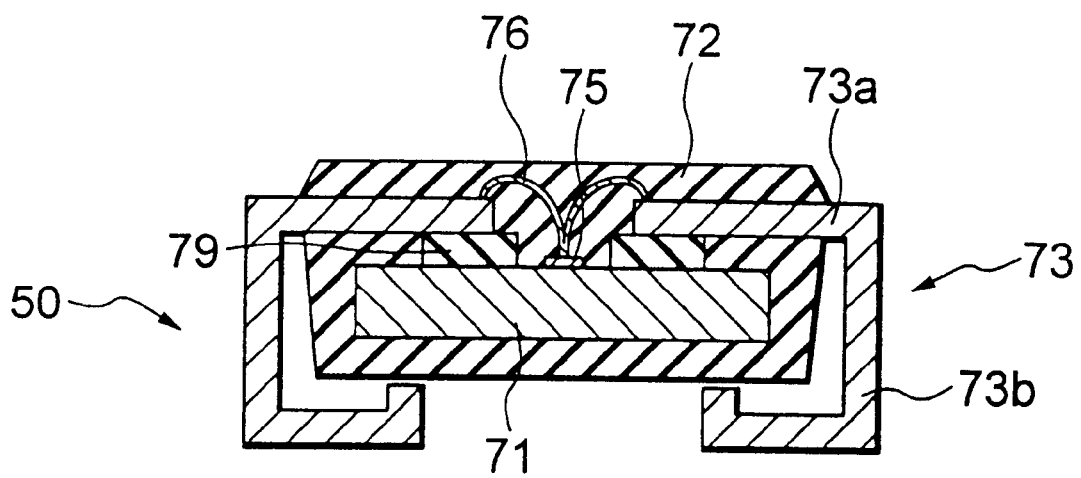
FIG. 1 is a sectional view showing a semiconductor device wherein a lead is used as a connection terminal.
Figure 2A:
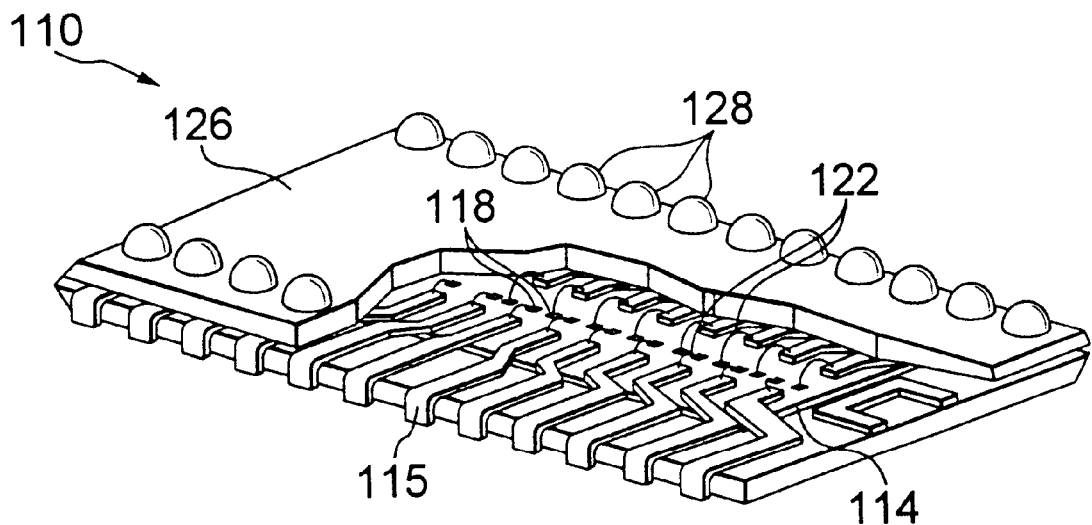
FIG. 2A is a perspective view showing a semiconductor device having a BGA structure which device is disclosed in U.S. Pat. No. 5,677,566.
Figure 2B:
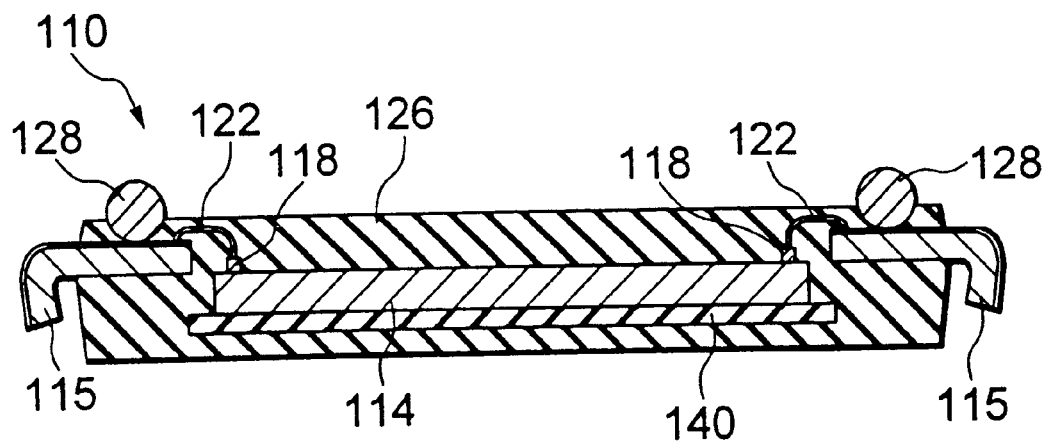
FIG. 2B is a sectional view thereof.
Figure 3A:
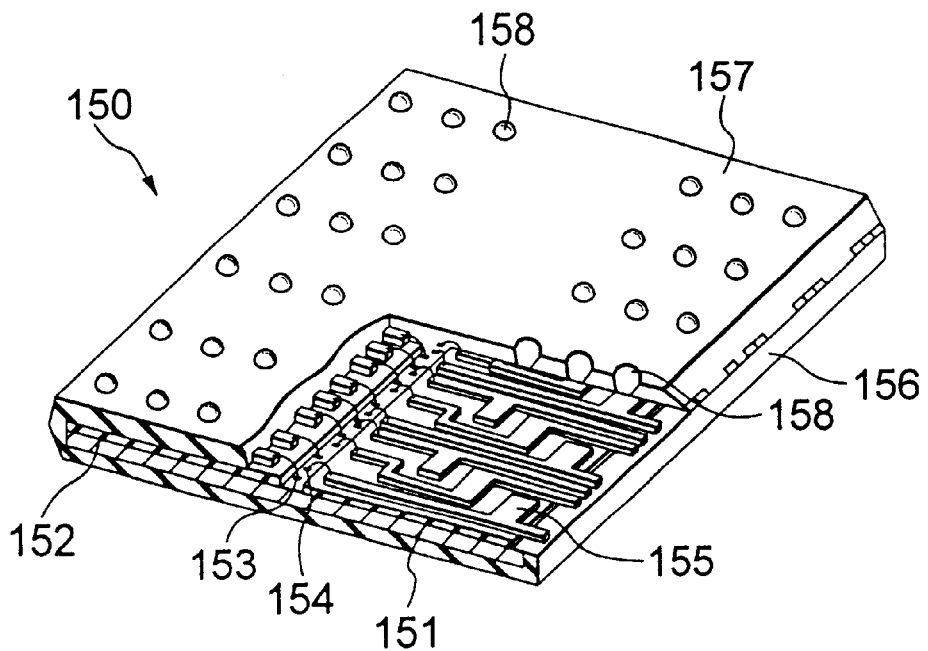
FIG. 3A is a perspective view showing a semiconductor device having a BGA structure which device is disclosed in the Japanese Patent Application Laid-Open No. Hei 9-213839.
Figure 3B:
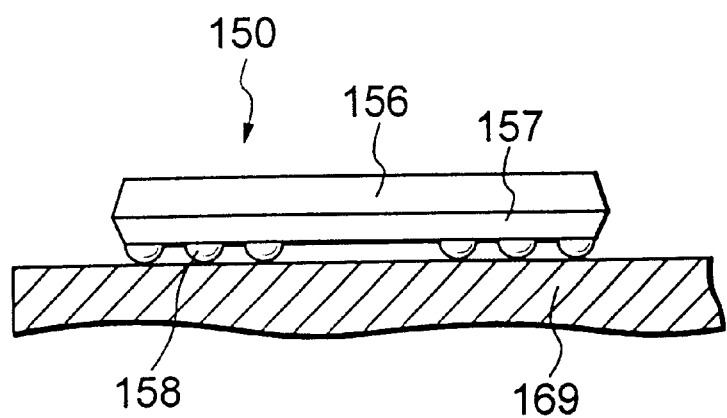
FIG. 3B is a sectional view thereof.
Figure 4A:
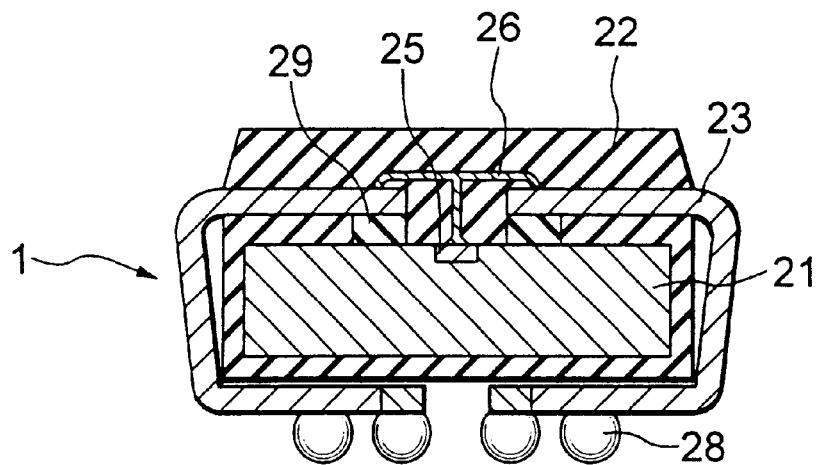
FIG. 4A is an overall sectional view showing the semiconductor device having the BGA structure according to a first embodiment of the present invention.
Figure 4B:
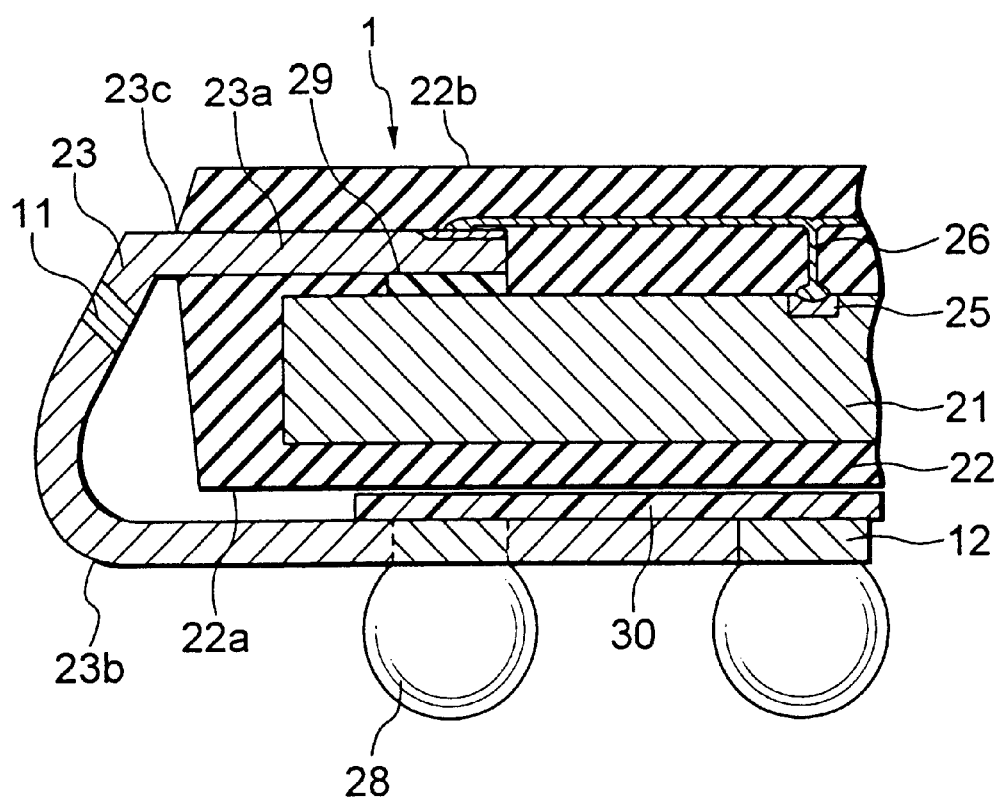
FIG. 4B is a partial sectional view thereof.
Figure 5:
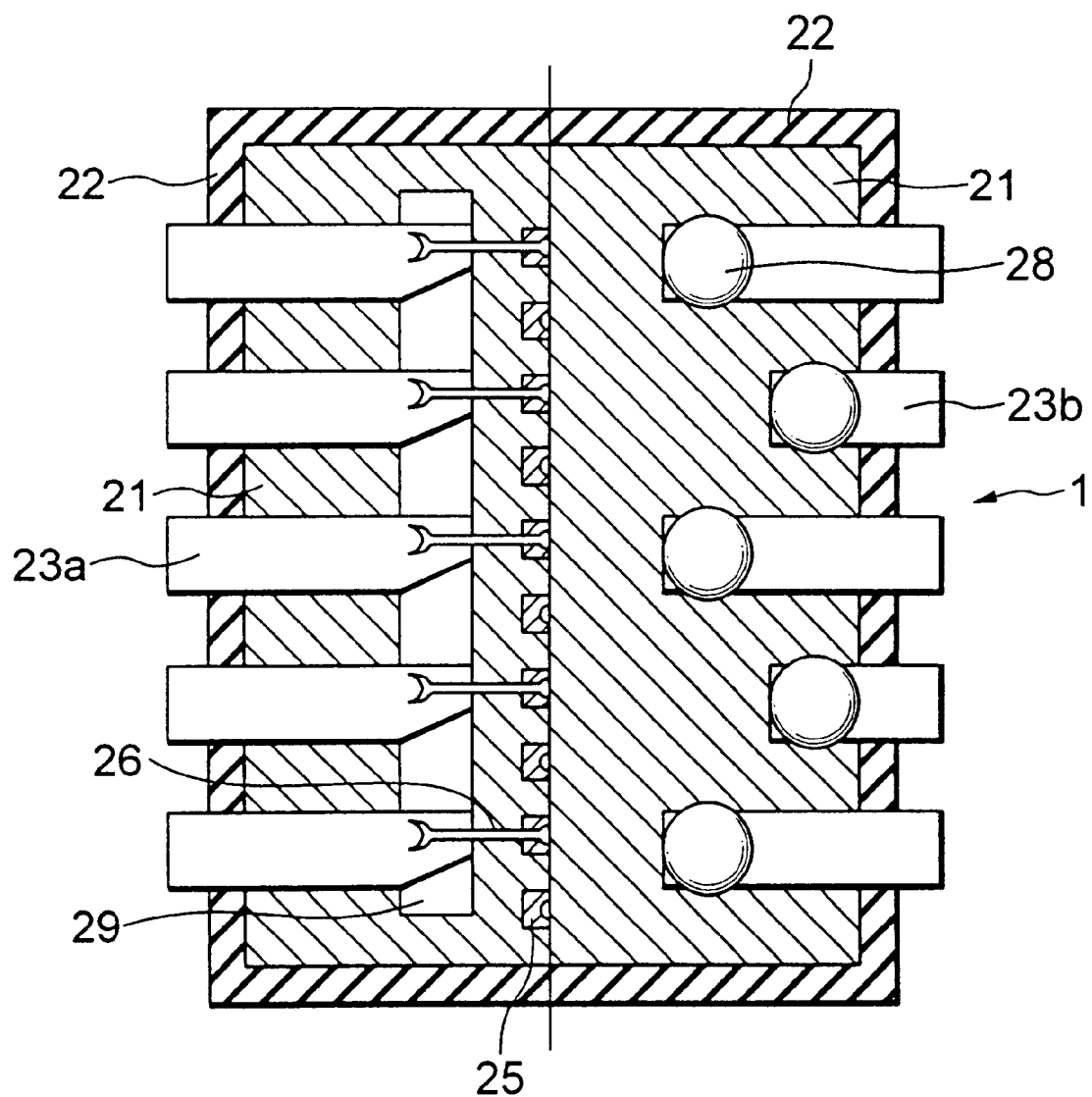
FIG. 5 is a plane view showing the semiconductor device having the BGA structure according to the first embodiment of the present invention.

A semiconductor device having a BGA structure and a method for manufacturing the same semiconductor device will be specifically explained hereinafter by referring to the accompanying drawings. FIG. 4A is an overall sectional view showing the semiconductor device having the BGA structure according to the first embodiment of the present invention. FIG. 4B is a partial sectional view thereof. FIG. 5 is a plane view thereof as well. Incidentally, the left half is a top view thereof while the right half is a bottom view thereof and a part of the resin sealed part is omitted in FIG. 5.

As shown in FIGS. 4A and 4B, and as shown in FIG. 5, the semiconductor device 1 having the BGA structure according to the first embodiment of the present invention has a semiconductor chip 21. Above the semiconductor chip 21, the plurality of internal leads 23a of connection leads 23 are arranged in parallel with the upper surface of the semiconductor chip 1. The semiconductor chip 21 and the internal leads 23a of the connection leads 23 are stuck and fixed with the sticking tape comprising a silicone type or an epoxy type insulator. Furthermore, the plurality of pads 25 and the internal leads 23a of the connection leads 23 are electrically connected with wires 26 by means of a wire bonding method.

The semiconductor chip 21, the sticking tape 29, the internal leads 23a of the connection leads 23, the pads 25 and the wires 26 are covered so that the resin sealed part 22 is formed. In addition, external leads 23b of the connection leads 23 are allowed to be extended from the resin sealed part 22 to be bent. The tip parts thereof are arranged in such a manner that the position of each of the tip parts is changed alternately with respect to the external leads 23b adjacent to the downward direction of the lower surface 22a of the resin sealed part 22. Incidentally, on the surface opposite to the lower surface 22a of the resin sealed part of the external leads 23b a silicone tape 30 is stuck with a gap with the lower surface 22a thereof. In the embodiment, the silicone tape is used, but the present invention is not limited thereto. For example, either a thermosetting resin tape or a thermoplastic resin tape may be used.

In addition, on each of the tip parts of the external leads 23b, a land 12 is formed respectively. On each land 12, a solder ball 28 is stuck respectively. The surface of the tip part of the external lead 23b is treated in order to improve the wettability of the solder.

By means of the reflow method for allowing the solder balls 28 to come into contact with the predetermined positions of the printed wiring board and heating or pressing the solder ball 28 to melt, the semiconductor device is fixed to a predetermined position of the printed wiring board, and, at the same time, the semiconductor device is electrically connected and is attached on the printed wiring board. Incidentally, after the assembling tie-bar 11 for connecting each connection lead 23 is cut off from the connection lead 23.

Incidentally, a main measurement in the present embodiment will be shown hereinafter. The thickness of the resin sealed part 22 may be 300 µm, the thickness of the resin sealed part 22 may be 725 µm, the thickness of the sticking tape 29 may be 50 µm, the thickness of the connection lead 23 may be 125 µm, an external diameter of the wire 26 may be 25 to 30 µm, a distance between the upper surface of the internal lead 23a and the upper surface of the resin sealed part may be 150 µm, a distance between the lower surface of the semiconductor chip 21 and the lower surface 22a of the resin sealed part may be 100 µm, a distance between the upper surface 22b of the resin sealed part and the lower surface of the external lead 23b may be 900 µm at most, a distance between the lower surface 22a of the resin sealed part and the upper surface of the external lead 23b may be 50 µm, an external diameter of the land 12 may be 350 µm, an external diameter of the solder ball 28 may be 400 to 450 µm, a distance of the direction in which the external lead 23b between the adjacent solder balls 28 extends may be 800 µm, a distance between the lower surface of the land 12 and the lower end of the solder ball 28 may be 300 µm, a distance between the upper surface 22b of the resin sealed part and the lower end of the solder ball 28 may be 1200 µm at most, a distance in the horizontal direction between the side of the semiconductor chip 21 and the boundary 23c may be 200 µm, a distance in the horizontal direction between the boundary 23c and the bent part of the external lead 23b may be 200 µm, a distance between the boundary 23c and the tie-bar 11 may be 200 µm, and the width of the tie-bar 11 may be 80 µm.

Next, a method for manufacturing the semiconductor device 1 having the BGA structure according to the first embodiment of the present invention will be explained in detail hereinafter. FIGS. 6A through 6D are sectional views showing in an order of the steps a method for manufacturing the semiconductor device having the BGA structure according to the first embodiment of the present invention.

Figure 6A:
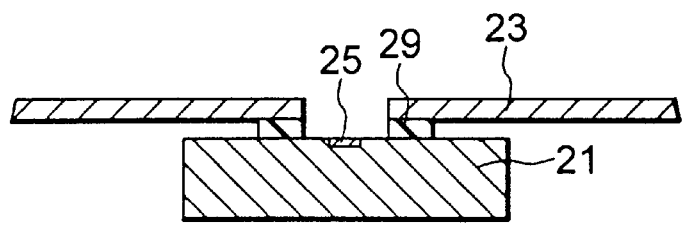
FIGS. 6A through 6D are sectional views showing in an order of steps a method for manufacturing the semiconductor device having the BGA structure according to the first embodiment of the present invention.

First, as shown in FIG. 6A, on the upper surface of the semiconductor chip 21, the connection lead 23 connected to the lead frame with the sticking tape 29 is stuck and fixed.

Figure 6B:
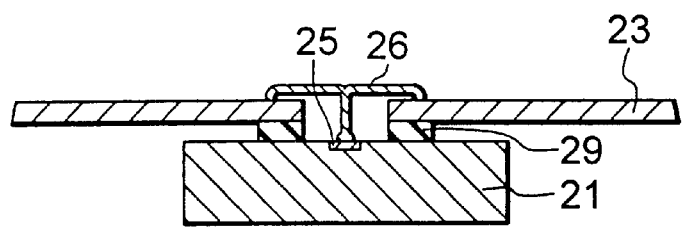

Next, as shown in FIG. 6B, a pad 25 formed at the central part of the upper surface of the semiconductor chip 21 and the connection lead 23 are electrically connected with a wire 26 by means of a wire boding method.

Figure 6C:
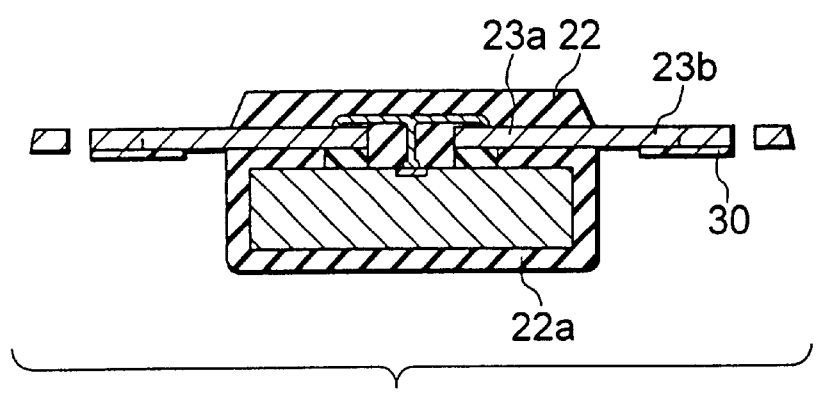

Thereafter, as shown in FIG. 6C, the semiconductor chip 21, the sticking tape 29, the connection lead 23, the pad 25 and the wire 26 are covered by using a mold, and a resin sealed part 22 is formed. At this time, a part of the connection lead 23 (an external lead 23b) is allowed to be extended from the resin sealed part 22. Then, on a lower surface of the external lead 23b, a silicone tape 30 is stuck, and the external lead 23b is cut to a predetermined length. At this time, the connection lead 23 is separated from the lead frame.

Figure 6D:
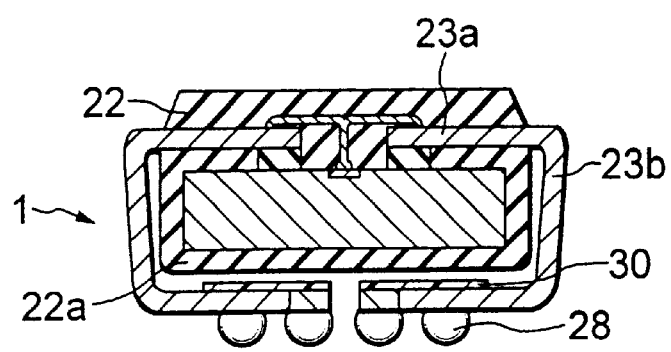

Next, as shown in FIG. 6D, the external lead 23b is bent back, and then the silicone tape 30 is arranged in such a manner that a gap is formed between the lower surface 22a of the resin sealed part and the external lead 23b. Then, a land 12 is formed at the tip part of the external lead 23b. The surface of the tip part of the external lead 23b is treated in order to improve the wettability thereof. On the lower surface of the land 12, a solder ball 28 is bonded. Next, the tie-bar 11 connecting the connection leads 23 is cut off from the connection lead 23. In this manner, the semiconductor device 1 having the BGA structure is manufactured.

In the semiconductor device 1 having the BGA structure according to the first embodiment of the present invention which is constituted in this manner, the impact which is propagated from the printed wiring board to the solder ball 28 is absorbed with the elastic deformation of the connection lead 23 at the time of the fall impact test and the temperature cycle test, which are performed in the state in which the semiconductor device is attached on the printed wiring board. By such a procedure, the generation of the cracks on the solder ball 28 can be prevented.

Even in the case where the impact propagated from the printed wiring board to the solder ball is not enough absorbed with the elastic deformation of the connection lead 23, the tip part of the connection lead 23 does not come into contact with the lower surface 22a of the resin sealed part because a silicon tape 30 is provided on a surface opposite to the lower surface 22a of the resin sealed part. Because of this, the impact propagated to the resin sealed part 22 can be absorbed with the result that the impact applied to the solder ball 28 from the resin sealed part 22 by the reaction can be reduced. Thus, even in the case where the impact cannot be enough absorbed with the elastic deformation of the connection lead 23, the generation of the crack in the solder ball 28 can be prevented.

Incidentally, according to the first embodiment of the present invention, a plurality of pads 25 are formed on the central part of the upper surface of the semiconductor chip 21, and the solder balls 28 are formed in the downward direction of the lower surface 22a of the resin sealed part, but the constitution is not limited to this in the present invention. Other embodiments of the present invention will be explained hereinafter.

Figure 7A:
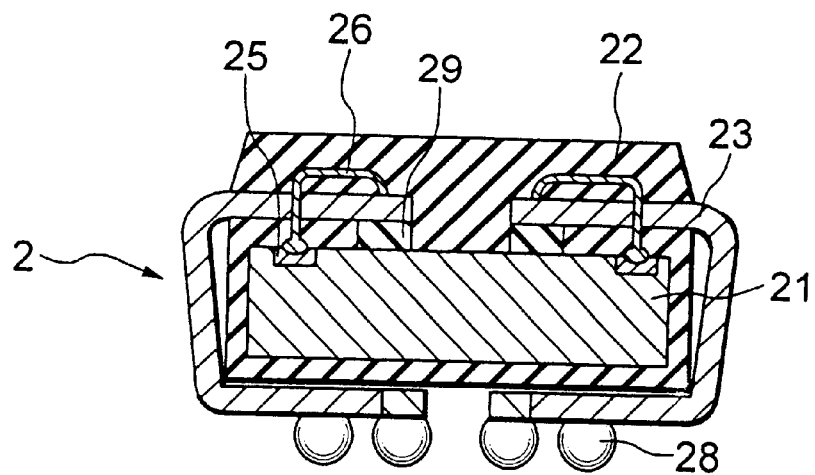
FIG. 7A is an overall sectional view showing the semiconductor device having the BGA structure according to a second embodiment of the present invention.
Figure 7B:
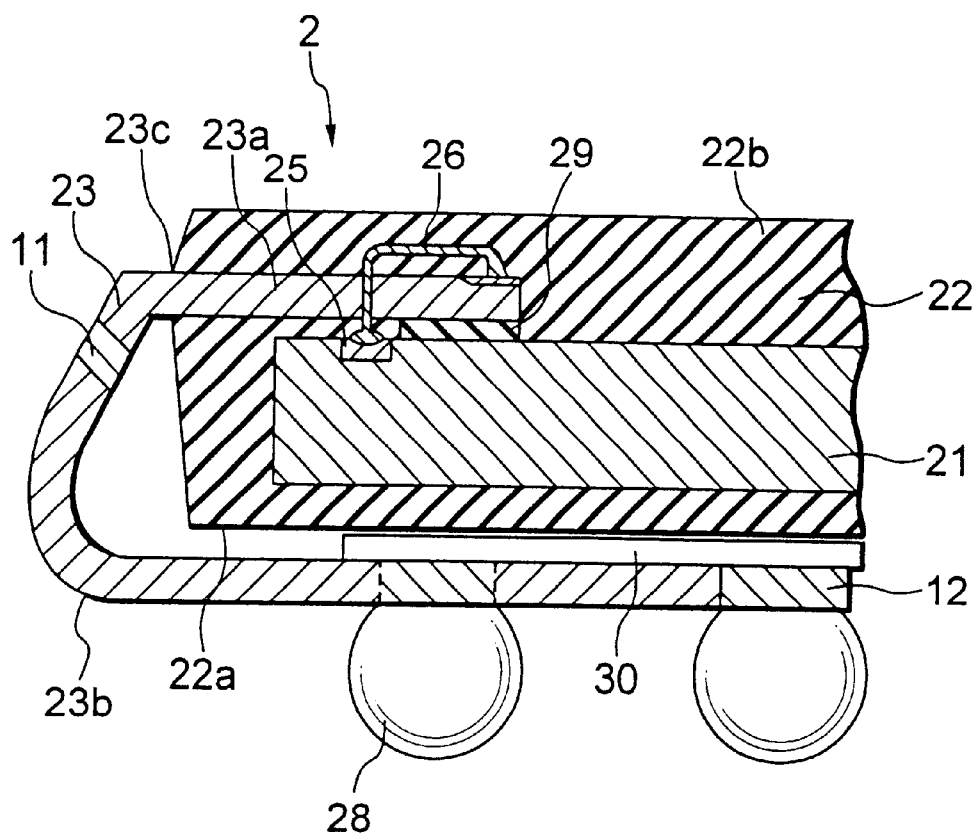
FIG. 7B is a partial sectional view thereof.

FIG. 7A is an overall sectional view showing the semiconductor device having the BGA structure according to the second embodiment of the present invention. FIG. 7B is a partial sectional view thereof. As shown in FIGS. 7A and 7B, in the semiconductor device 2 having the BGA structure according to the second embodiment of the present invention, a plurality of pads 25 are formed at the upper surface end of the semiconductor chip 21. These pads 25 and the internal leads 23a of the connection leads 23 are electrically connected with the wires 26. Other aspects of the embodiment are the same as the semiconductor device 1 having the BGA structure according to the first embodiment of the present invention, and an explanation thereof is omitted.

Figure 8A:
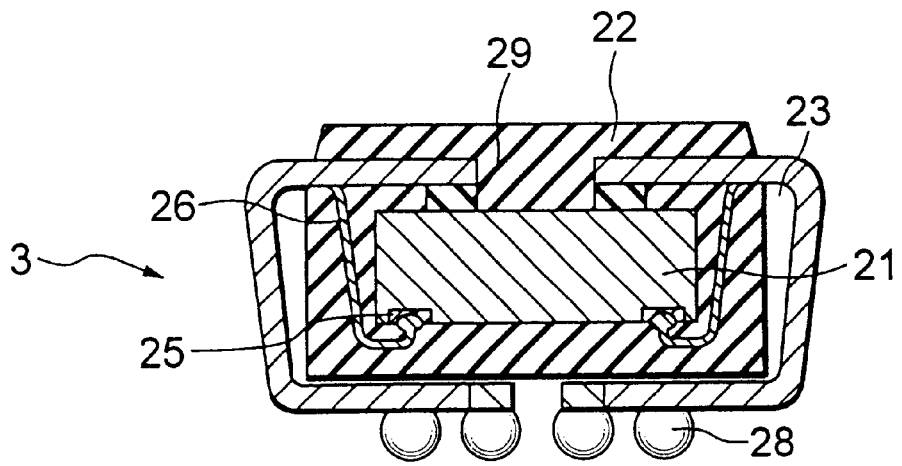
FIG. 8A is an overall sectional view showing a semiconductor device having the BGA structure according to a third embodiment of the present invention.
Figure 8B:
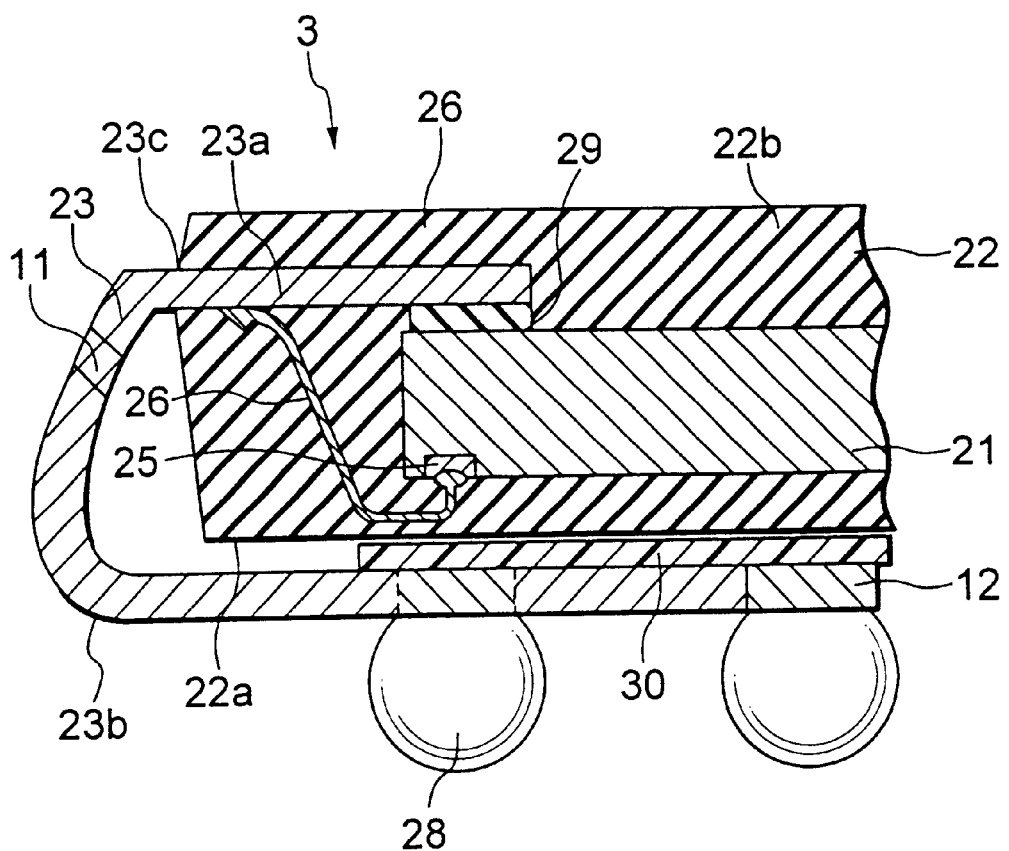
FIG. 8B is a partial sectional view thereof.

FIG. 8A is an overall sectional view showing the semiconductor device having the BGA structure according to the third embodiment of the present invention. FIG. 8B is a partial sectional view thereof. As shown in FIGS. 8A and 8B, in the semiconductor device 3 having the BGA structure according to the third embodiment of the present invention, a plurality of pads 25 are formed at the end part of the lower surface of the semiconductor chip 21. The pads 25 and the internal leads 23a of the connection leads 23s are electrically connected with the wires 26.

Incidentally, as described hereinafter, a main measurement of a part in the third embodiment is different from the counterpart in the first embodiment. A distance between the upper surface of the internal lead 23a and the upper surface 22b of the resin sealed part may be 100 μm, a distance between the lower surface of the semiconductor chip 21 and the lower surface 22a of the resin sealed part 22 may be 150 μm, and a distance in the horizontal direction between the side of the semiconductor chip 21 and the boundary 23c may be 600 μm.

Other constitution and the measurement are the same as the semiconductor device 1 having the BGA structure according to the first embodiment, and a detailed explanation thereof is omitted.

Both the second and the third embodiments in these manner can provide an effect same as the first embodiment.

Figure 9:
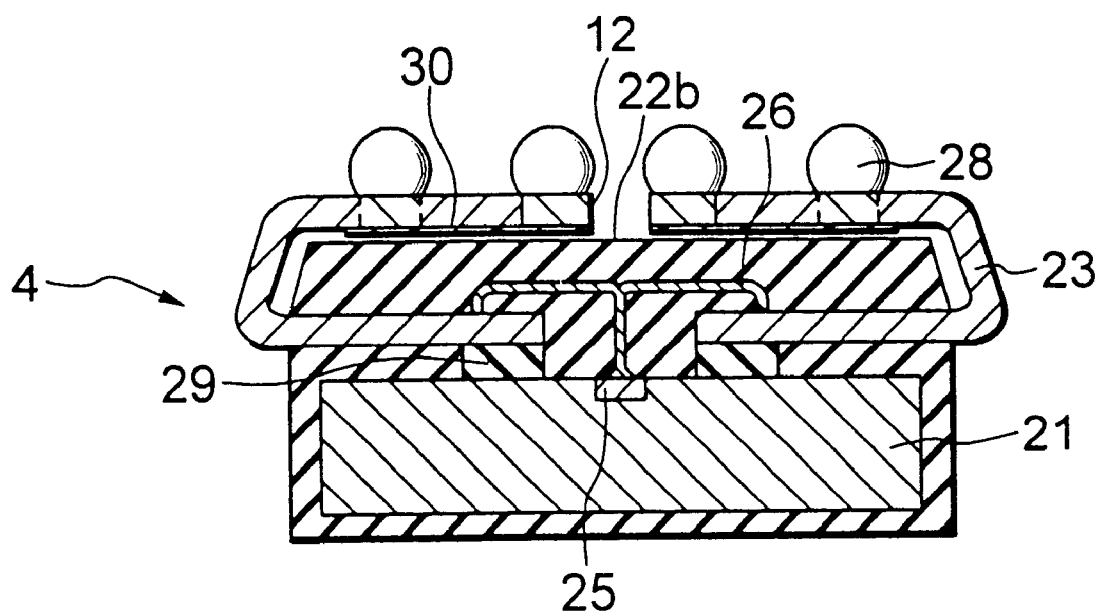
FIG. 9 is a sectional view showing the semiconductor device having the BGA structure according to a fourth embodiment of the present invention.

FIG. 9 is a sectional view showing the semiconductor device having the BGA structure according to the fourth embodiment of the present invention. As shown in FIG. 9, in the semiconductor device 4 having the BGA structure according to the fourth embodiment of the present invention, the external leads 23b of the connection leads are extended from the resin sealed part 22 to be bent. The external leads 23b are arranged above an upper surface of the resin sealed part 22. On a surface of the external lead 23b opposite to the upper surface 22b of the sealing part, a silicone tape 30 is stuck. Lands 12 are formed on each tip part of the external leads 23b respectively. The solder balls 28 are bonded to the lands 12 respectively. Other aspects of the embodiment are the same as the semiconductor device 1 having the BGA structure according to the first embodiment, and an explanation thereof is omitted.

In the semiconductor device 4 having the BGA structure according to the present invention which device is constituted in this manner, the solder ball 28 can be arranged above the resin sealed part 22, and, at the same time, the effect same as the first embodiment can be provided.

Figure 10A:
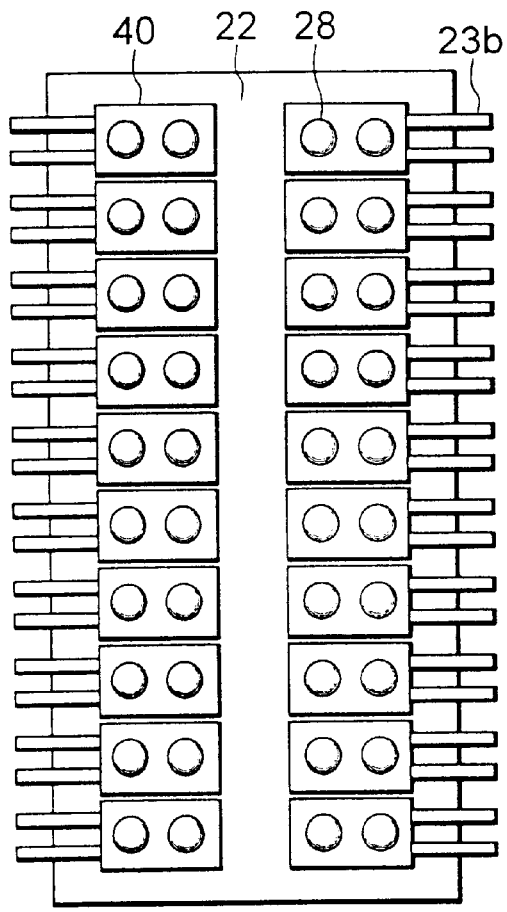
FIG. 10A is an overall plane view showing the semiconductor device having the BGA structure according to a fifth embodiment of the present invention.
Figure 10B:
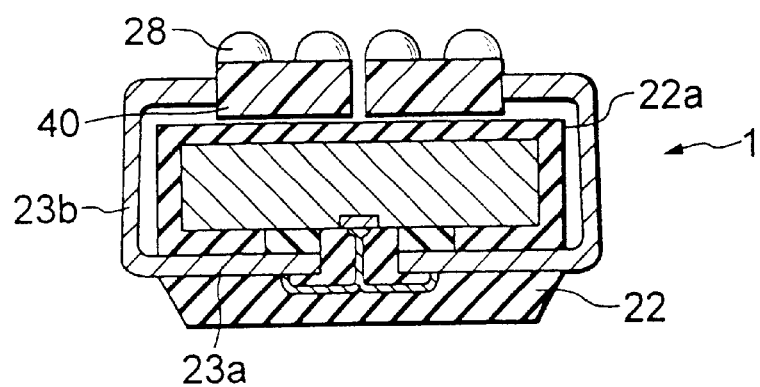
FIG. 10B is a sectional view thereof.

FIG. 10A is an overall view showing the semiconductor device having the BGA structure according to the fifth embodiment of the present invention. FIG. 10B is a sectional view thereof. In the semiconductor device having the BGA structure according to the fifth embodiment, a lead is extended from the resin sealed part 22, and a lead resin part 40 is formed at a tip part of the lead. The lead resin part 40 is formed at the same time as the resin sealed part 22. On the lead resin part 40, solder balls 28 are bonded. The lead resin part 40 of the present embodiment seals two leads respectively, but the number of the leads can be arbitrarily set.

FIGS. 11A through 11D are sectional views showing in an order of steps a method for manufacturing the semiconductor device having the BGA structure according to the fifth embodiment of the present invention.

Figure 11A:
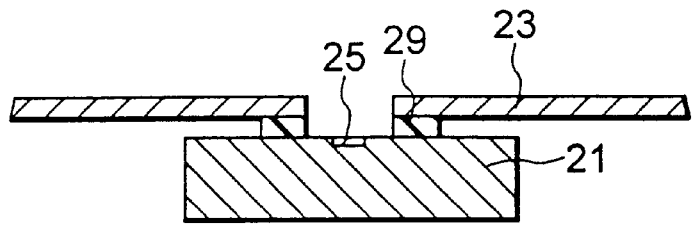
FIG. 11A through 11D are sectional views showing in an order of steps a method for manufacturing the semiconductor device having the BGA structure according to the fifth embodiment of the present invention.

First, as shown in FIG. 11A, the connection lead 23 connected to the lead frame with the sticking tape 29 is stuck and fixed on an upper surface of the semiconductor chip 21.

Figure 11B:
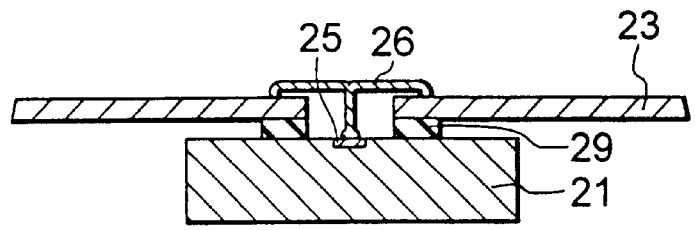

Next, as shown in FIG. 11B, the pad 25 formed at the central part of the upper surface of the semiconductor chip 21 and the connection lead 23 are electrically connected with the wire 26.

Figure 11C:
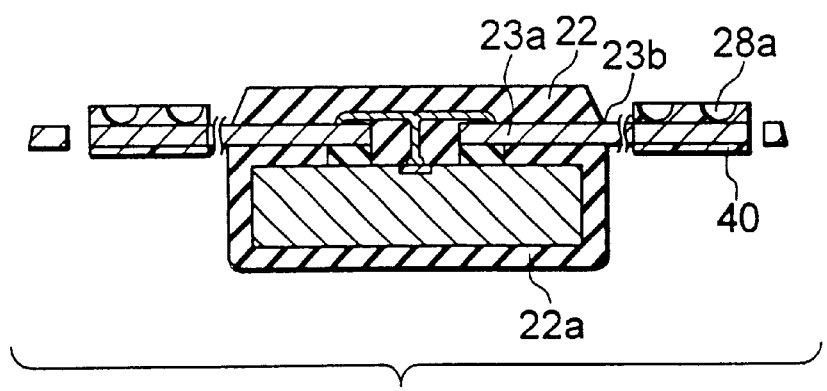

Thereafter, as shown in FIG. 11C, the semiconductor chip 21, the sticking tape 29, the connection lead 23, the pad 25 and the wire 26 are covered by using a mold thereby forming a resin sealed part 22. At this time, a part of the connection lead 23 (the external lead 23b) is sealed with resin to form the lead resin part 40. Then, the lead resin 40 is opened by means of a method such as a laser or the like, and solder ball holes 28a are formed. The lead resin part 40 is cut one by one or in a group of plurality of leads by means of a cutting method using a laser or the like.

Figure 11D:
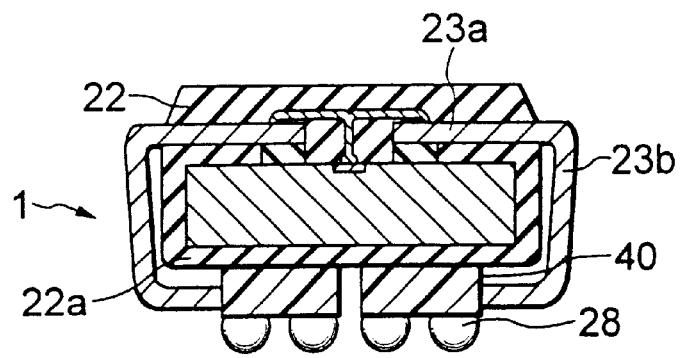

Next, as shown in FIG. 11D, the external lead 23b is bent back, and the lead resin part 40 is arranged so that a gap can be formed between the lower surface of the resin sealed part 22 and the external lead 23b. Next, on each of the lead resin 40, the solder balls 28 are attached and connected by means of the reflow method.

In the semiconductor chip according to the fifth embodiment of the present invention, the taping of the lead is not carried out, and the sealing of the lead resin can be performed at the same time with the resin sealing of the package main body. As a result, the processing cost and the material cost of the taping is not required, and the lead resin can be manufactured at a low cost. Furthermore, the whole resin to which the resin sealing is performed is not used for the formation of the package. A part corresponding to the resin channel of the mold and the part of the resin tablet is regarded as unnecessary and is discarded. Thus, the lead resin can be sufficiently provided only by the reduction of the discarded part. Thus, the amount of the resin affecting the material cost is not increased.

Furthermore, if only the package is attached on the wiring substrate or the like to cut the resin for fixing the lead by means of a laser or the like, a crack is generated in the solder ball or the solder ball is broken with a difference in the thermal expansion rate between the package and the wiring substrate. Since, in the fifth embodiment, the lead fixed resin is divided, the thermal expansion rate is absorbed by the movement of the lead thereby preventing the generation of the crack in the solder ball and the destruction of the solder ball itself.

In these manner, according to the present invention, the impact propagated from the printed wiring board to the solder ball at the time of the fall impact test and the temperature cycle test, which are carried out in the state in which the semiconductor device is attached on the printed wiring board is absorbed with an elastic deformation of the connection lead. As a consequence, the generation of the crack in the solder ball can be prevented.

What is claimed is:

1. A semiconductor device having a BGA structure comprising:

a semiconductor chip;

a connection lead connected to a pad of said semiconductor chip, said connection lead having a tip part which is bent up to a surface of said semiconductor chip on the opposite side of said pad;

a resin sealed part covering said semiconductor chip; and a solder ball provided on said tip part of said connection lead, wherein a gap is formed between said tip part of said connection lead and said resin sealed part.

2. A semiconductor device having a BGA structure comprising:

a semiconductor chip;

a connection lead connected to a pad of said semiconductor chip, said connection lead having a tip part which is bent back;

a resin sealed part covering said semiconductor chip; and a solder ball provided on said tip part of said connection lead, wherein a gap is formed between said tip part of said connection lead and said resin sealed part.

3. A semiconductor device having a BGA structure comprising:

a semiconductor chip;

a connection lead connected to a pad of said semiconductor chip, said connection lead having a tip part which is bent back;

a resin sealed part covering said semiconductor chip;

a lead resin part provided at said tip part of said connection lead; and a solder ball provided on said lead resin part, wherein a gap is formed between said tip part of said connection lead and said resin sealed part.

4. The semiconductor device having a BGA structure according to claim 1, which further comprising a buffer member provided on said tip part of said connection lead in said gap.

5. The semiconductor device having the BGA structure according to claim 2, which further comprising a buffer member provided on said tip part of said connection lead in said gap.

6. The semiconductor device having the BGA structure according to claim 4, wherein said buffer member is made of a tape selected from a group comprising a silicone tape, a thermosetting tape and a thermoplastic tape.

7. The semiconductor device having the BGA structure according to claim 5, wherein said buffer member is made of a tape selected from a group comprising a silicone tape, a thermosetting tape and a thermoplastic tape.

* * * * *